United States Patent
Nishimura

(10) Patent No.: US 6,768,133 B2
(45) Date of Patent: Jul. 27, 2004

(54) SEMICONDUCTOR DEVICE, TEST METHOD FOR SEMICONDUCTOR DEVICE, AND TESTER FOR SEMICONDUCTOR DEVICE

(75) Inventor: Yasumasa Nishimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/124,453

(22) Filed: Apr. 18, 2002

(65) Prior Publication Data

US 2003/0059967 A1 Mar. 27, 2003

(30) Foreign Application Priority Data

Sep. 25, 2001 (JP) ......................................... 2001-290976

(51) Int. Cl.$^7$ ............................................. H01L 23/58
(52) U.S. Cl. ...................................... 257/48; 327/165
(58) Field of Search ............................................ 257/48

(56) References Cited

U.S. PATENT DOCUMENTS 6,278,128 B1 * 8/2001 Noji et al. ..................... 257/48
6,469,396 B1 * 10/2002 Kawai ......................... 257/784

* cited by examiner

*Primary Examiner*—Douglas Wille
(74) *Attorney, Agent, or Firm*—McDermott Will & Emery LLP

(57) ABSTRACT

The present invention comprises: a plurality of output terminals through which a signal from an internal circuit is output; buffer circuits, each provided between one of the plurality of output terminals and the internal circuit; and a delay circuit connected to the specific buffer, the delay circuit delaying the signal from the internal circuit. With this arrangement, it is possible to measure a delay time from an input test signal even when a super-high-speed device is tested.

4 Claims, 6 Drawing Sheets

Fig. 3
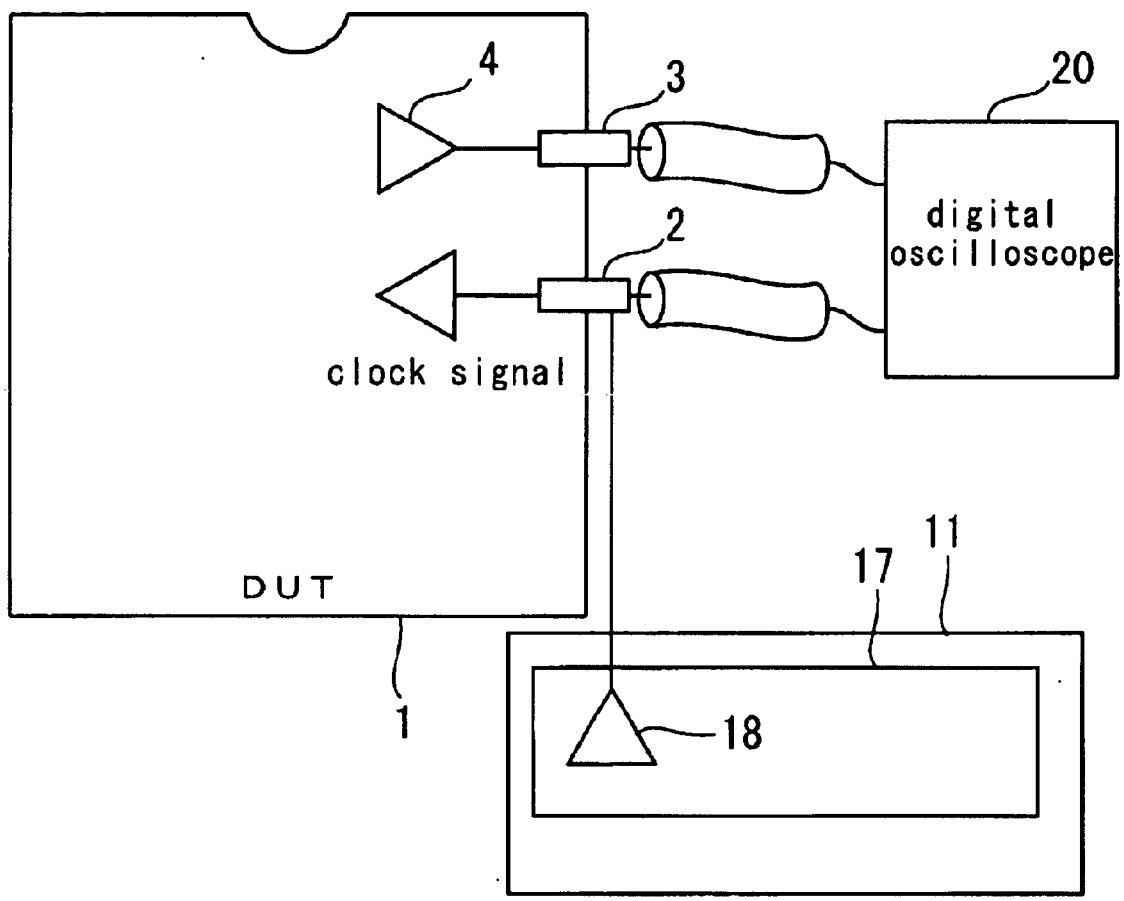
Fig. 4A
Fig. 4B
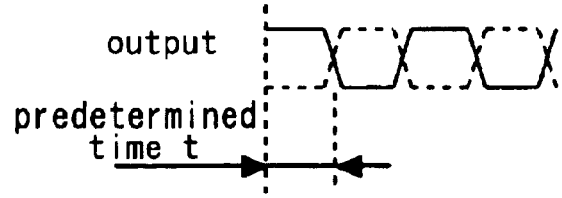

SEMICONDUCTOR DEVICE, TEST METHOD FOR SEMICONDUCTOR DEVICE, AND TESTER FOR SEMICONDUCTOR DEVICE

BACKGROUND OF THE INVENTION

1. Field of the Invention

The present invention relates to a semiconductor device, a test method for a semiconductor device, and a tester for a semiconductor device. In particular, the present invention relates to a high-speed semiconductor device.

2. Background Art

After its fabrication, a semiconductor device is subjected to various tests such as timing tests and functional tests. Description will be made of a test method for a semiconductor device using a tester 101 with reference to FIG. 8. As shown in the figure, a semiconductor device 105 to be tested, which is hereinafter referred to as a DUT (Device Under Test), is connected to the tester 101 in the test.

The tester 101 comprises a tester main unit 102, a test head 103, and a pin electronics card 104. The tester main unit 102 generates a test pattern signal required as a test condition for the DUT 105. FIG. 8 shows the DUT 105 and the tester 101 disposed side by side, for convenience. In the actual test, however, the DUT 105 is stored in the test head 103 and tested.

FIG. 9 is a schematic diagram showing the configuration of the pin electronics card 104. In the test, upon receiving a signal from the tester main unit 102, a tester driver 111 of the pin electronics card 104 generates a test signal that is then applied to the DUT 105. The response signal from the DUT 105 is received by a comparator 112 in the pin electronics card 104, and the comparator 112 compares the signal with its expected value. Then, the tester 101 determines whether or not the DUT 105 operates as specified by its design.

However, as semiconductor devices have become complicated and their scale has increased, testing of semiconductor devices has become more and more difficult to carry out. Furthermore, since the operating speeds of the devices have been accelerated increasingly, a timing test for ensuring their high-speed operation requires very high timing accuracy.

To cope with such super-high-speed operation of the devices, a two-path system has been widely adopted in which an expensive high-precision tester is used only for a high-speed operation test and a tester of low precision is used for a low-speed test, specifically, a functional test, in order to reduce the cost. Recently, however, the speed of the devices has further increased, and will continue to increase in the future, requiring execution of a high-precision test on a super-high-speed device, which necessitates a more expensive tester. This makes it difficult to test the devices at a reasonable cost.

When checking a super-high-speed and large-scale semiconductor device by use of the conventional tester 101 shown in FIG. 8, it is necessary to replace the tester 101 with an expensive high-precision tester to test high-speed operation of the device even in the case where the two-path system is adopted. This means that as the speed of devices becomes higher, it is necessary to employ an expensive high-precision tester to enhance the test accuracy, putting a limit on reduction of the test cost.

One reason why the high-precision tester is expensive is that the tester 101 must include a plurality of high-precision pin electronics cards 104. This is because it is necessary to provide a number of pin electronics cards 104 corresponding to the number of a plurality of output terminals included in the DUT 105. In the conventional high-precision tester, for example, it is necessary to employ a number of pin electronics cards 104 equal to the number of the output terminals included in the DUT 105, inevitably increasing the cost of the tester 101.

SUMMARY OF THE INVENTION

In view of the foregoing, the present invention has been made, and it is an object of the present invention to provide a semiconductor device, a test method for a semiconductor device, and a tester for a semiconductor device that are able to realize a low-cost high-speed timing test.

According to one aspect of the present invention, a semiconductor device comprises a plurality of output terminals, a plurality of buffer circuits, and a delay means. Signals from an internal circuit are output through the output terminals. Each buffer circuit is provided between one of the plurality of output terminals and the internal circuit. The delay means is connected to a specific one of the plurality of buffer circuits. The delay means delays a signal from the internal circuit.

According to another aspect of the present invention, there is provided a method for testing a semiconductor device having a plurality of output terminals. The method comprises the following steps. A test signal is applied to the semiconductor device. An output signal from only a specific one of the plurality of output terminals delayed. Timing delay characteristics of the semiconductor device evaluated based on the delayed output signal.

According to another aspect of the present invention, there is provided a tester for a semiconductor device. The tester comprises a test signal applying means and a plurality of comparison means. The test signal applying means is for applying a test signal to a semiconductor device to be tested. The comparison means is for receiving a plurality of output signals which are output from the semiconductor device based on the test signal. Each comparison means compares the output signal with predetermined expected values. A specific one of the plurality of comparison means is higher than the other ones of the plurality of comparison means in capability of evaluating timing delay characteristics.

Since a delay means is provided in a specific buffer circuit to delay a signal from an internal circuit, it is possible to measure a delay time from an input test signal even when a high-speed device is tested. Thus, it is possible to evaluate the timing delay characteristics of a semiconductor device with high precision and thereby provide a highly reliable semiconductor device.

Since a specific comparison means is made higher than the other comparison means in the capability of evaluating timing delay characteristics, only one comparison means included in a tester need be of high-precision type to be able to perform a timing test and a functional test on a high-speed semiconductor device with high precision. Therefore, it is possible to considerably reduce the cost of the tester and perform a highly reliable test.

Other and further objects, features and advantages of the invention will appear more fully from the following description.

BRIEF DESCRIPTION OF THE DRAWINGS

FIG. 3 is a schematic diagram showing a test method according to a second embodiment of the present invention.

FIGS. 4A and 4B are the pulse waveform of the input signal and the output signal observed on the digital oscilloscope.

DETAILED DESCRIPTION OF THE PREFERRED EMBODIMENTS

First Embodiment

Figure 1:
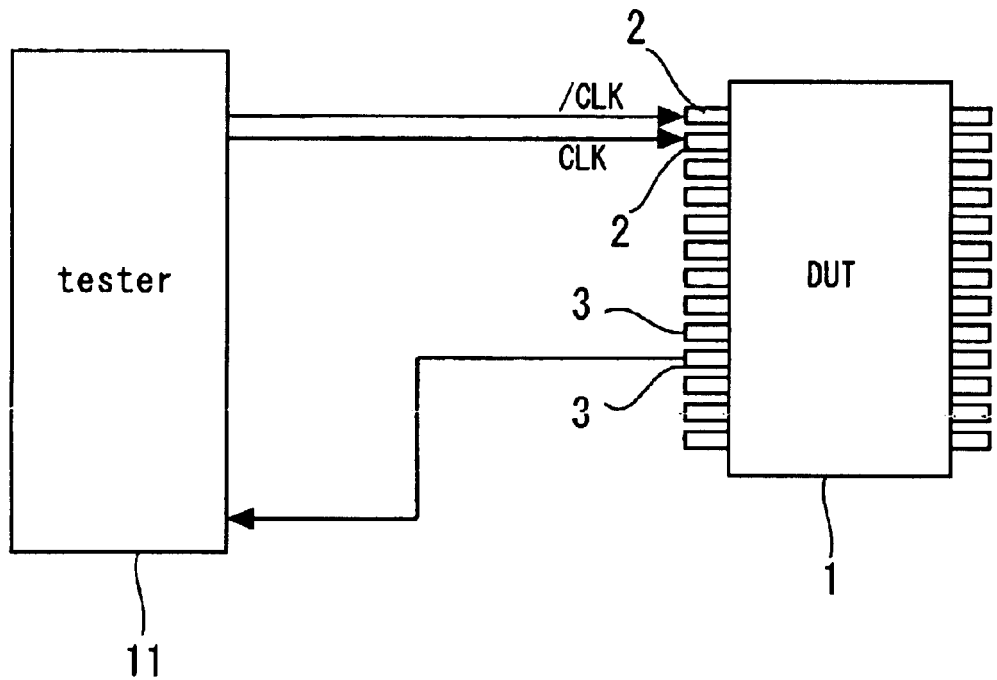
FIG. 1 is a schematic diagram showing a semiconductor device (DUT) and a tester connected to the DUT according to a fist embodiment of the present invention.

FIG. 1 is a schematic diagram showing a semiconductor device (DUT 1) and a tester 11 connected to the DUT 1 according to a fist embodiment of the present invention. As shown in the figure, the DUT 1 completed through a predetermined fabrication process is connected to the tester 11 and subjected to various tests.

In the test, test signals are input from the tester 11 to input terminals 2 of the DUT 1. For example, reference clock signals (CLK, /CLK) are used as the test signals. Then, a signal output from an output terminal 3 of the DUT 1 is input to the tester 11 to check the DUT 1. The tests to be performed at this step include a timing test for checking the operation timing and a functional test for checking the logic function.

Figure 2:
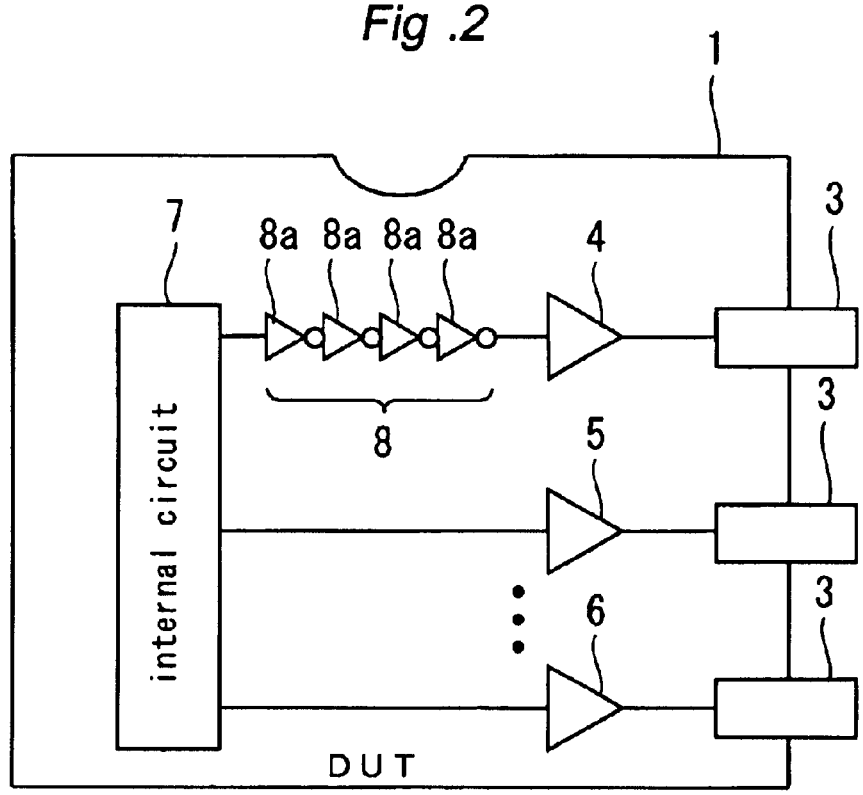
FIG. 2 is a schematic diagram showing the detailed configuration of the neighborhood of output terminals of the DUT.

FIG. 2 is a schematic diagram showing the detailed configuration of the neighborhood of output terminals 3 of the DUT 1. As shown in FIGS. 1 and 2, the DUT 1 includes a plurality of output terminals 3 each connected through a respective one of output buffer circuits 4, 5, 6, and so on to an internal circuit 7 of the DUT 1.

One of the plurality of output buffer circuits 4, 5, 6, and so on has a delay means. Specifically, the specific output buffer circuit is provided with the delay means so that the output of the specific output buffer circuit is always delayed from the outputs of the other output buffer circuits.

More specifically, as shown in FIG. 2, only the specific output buffer circuit 4 is provided with a delay circuit 8 prior to its output last stage. In this case, the delay circuit 8 is composed of an even number of inverter circuits 8a connected in series.

Thus, it is possible to intentionally delay the output of the output buffer circuit 4 by providing the output buffer circuit 4 with the delay circuit 8 in the DUT 1. This arrangement makes it possible to easily measure the timing speed characteristics (timing delay characteristics) of the DUT 1 based on the delayed output of the output buffer circuit 4.

Accordingly, the delay circuit 8 delays the input from the tester 11 by a predetermined time, making it possible to measure the timing speed characteristics of the DUT 1 with high precision and high sureness even when the DUT 1 is a high-speed device.

Furthermore, since the timing speed characteristics of the DUT 1 are evaluated based on the output of the output buffer circuit 4, the outputs of the other output buffer circuits 5, 6, and so on can be used to evaluate characteristics other than the timing speed characteristics, such as logic function characteristics. When evaluating a logic function, it is not necessary to delay the output. This means that the output buffer circuits 5, 6, and so on need not be provided with the delay circuit 8. Therefore, a simple configuration can be employed to evaluate both the timing speed characteristics and the logic function characteristics by providing the delay circuit 8 only for the output buffer circuit 4.

According to the first embodiment described above, since one of the output buffer circuits 4, 5, 6, and so on (specifically the output buffer circuit 4) is provided with the delay circuit 8, a delay time from an input test signal can be measured even when the DUT 1 is a super-high-speed device. With this arrangement, it is possible to test the DUT 1 with high precision and thereby provide a highly reliable semiconductor device.

Second Embodiment

FIGS. 3 and 4 are schematic diagrams showing a test method according to a second embodiment of the present invention. The test method according to the second embodiment uses a digital oscilloscope 20 to measure the timing speed characteristics of the DUT 1 that have been described above for the first embodiment. The configuration of the DUT 1 according to the second embodiment is the same as that for the first embodiment.

FIG. 3 is a diagram in which the DUT 1, the tester 11, and the digital oscilloscope 20 are connected to one another. As shown in the figure, one measuring terminal of the digital oscilloscope 20 is connected to the input terminal 2 of the DUT 1 for receiving a test signal. The other measuring terminal, on the other hand, is connected to the output terminal 3 to which the output buffer circuit 4 having the delay circuit 8 is also connected.

A tester driver 18 of a pin electronics card 17 included in the tester 11 sends a test signal to the DUT 1. Thus, the DUT 1 is operated by use of the test signal from the tester 11. The test signal and the output signal from the output buffer circuit 4 are observed on the digital oscilloscope 20 to measure the timing delay time.

With reference to FIG. 4, description will be made of a method for evaluating timing speed characteristics based on the output of the output buffer circuit 4 by use of the digital oscilloscope 20. In this method, the pulse waveforms of both a test signal (CLK) input from the tester 11 and the output signal of the output buffer circuit 4 are observed on the digital oscilloscope 20 to compare the waveforms of the input and the output signals. FIG. 4A denotes the pulse waveform of the input signal from the tester 11 observed on the digital oscilloscope 20, while FIG. 4B denotes the pulse waveform of the output signal from the output buffer circuit 4 observed also on the digital oscilloscope 20.

As shown in FIG. 4A and FIG. 4B, the delay circuit 8 provided for the output buffer circuit 4 delays the input signal from the tester 11 by a predetermined time t, and the delayed input signal is output from the output buffer circuit 4. With this arrangement, the tester 11 can measure the delay time t even when the DUT 1 is a super-high-speed device, making it possible to measure the timing speed characteristics with high precision.

According to the second embodiment described above, the delay time of an output signal from an input signal can be measured on an ordinary digital oscilloscope 20. Furthermore, the second embodiment eliminates the need for providing a means for evaluating the output of the output buffer circuit 4 on the tester 11 side. Therefore, it is possible to simplify the configuration of the tester 11 and evaluate the DUT 1 with high precision using existing facilities.

Third Embodiment

Figure 5:
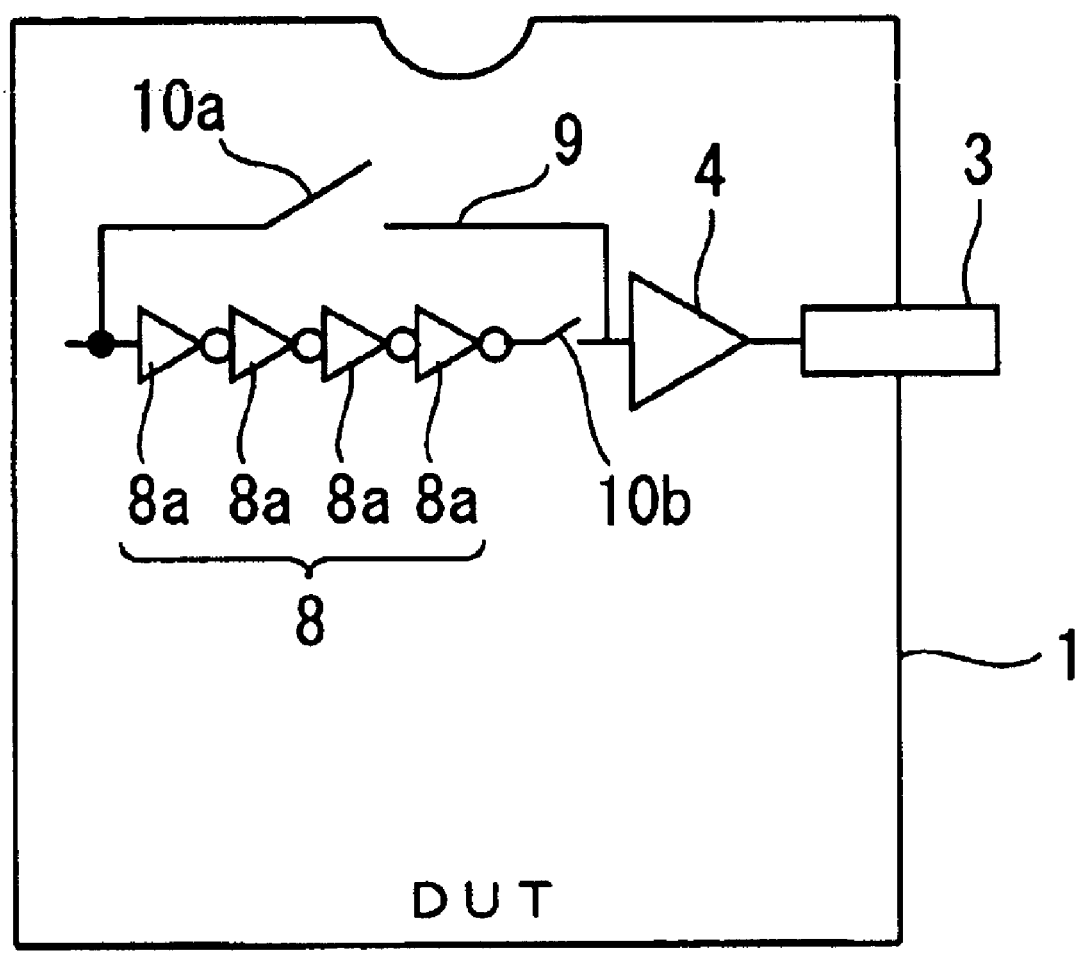
FIG. 5 is a schematic diagram showing a semiconductor device (DUT) according to a third embodiment of the present invention.

FIG. 5 is a schematic diagram showing a semiconductor device (DUT 1) according to a third embodiment of the present invention. The DUT 1 of the third embodiment uses the delay circuit 8 only when necessary.

The DUT 1 of the first embodiment has the delay circuit 8 inserted for the specific output buffer circuit 4. The delay circuit 8 is composed of an even number of inverter circuits 8*a*. On the other hand, as shown in FIG. 5, in parallel with the delay circuit 8, the third embodiment adds a bypass line 9 that is provided for the case in which it is not necessary to use the delay circuit 8 in actual operation of the device. The other configurations are the same as those of the first embodiment.

A function for the test modes realizes switching between the mode that uses the delay circuit 8 and the mode which uses the bypass line 9 without using the delay circuit 8. Specifically, relays 10*a* and 10*b* are closed or opened based on a command issued according to an input signal to the DUT 1.

According to the third embodiment described above, when the delay circuit 8 need not be used in actual operation of the device, it is possible to switch between the delay circuit 8 and the bypass line 9 by use of the relays 10*a* and 10*b*. Accordingly, actual operation of the device can be carried out without using the delay circuit 8.

Fourth Embodiment

Figure 6:
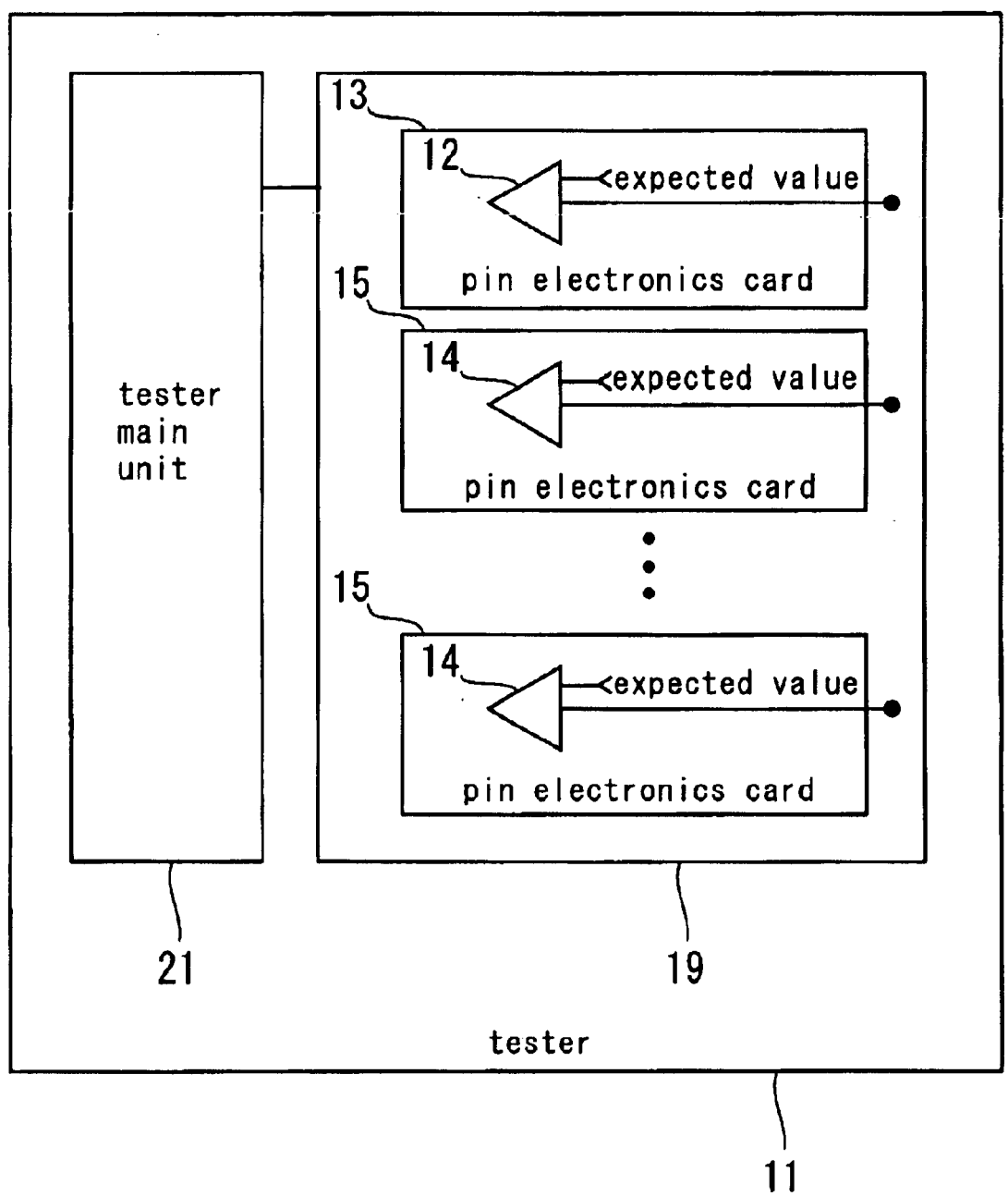
FIG. 6 is a schematic diagram showing the configuration of the tester according to the fourth embodiment.
Figure 7:
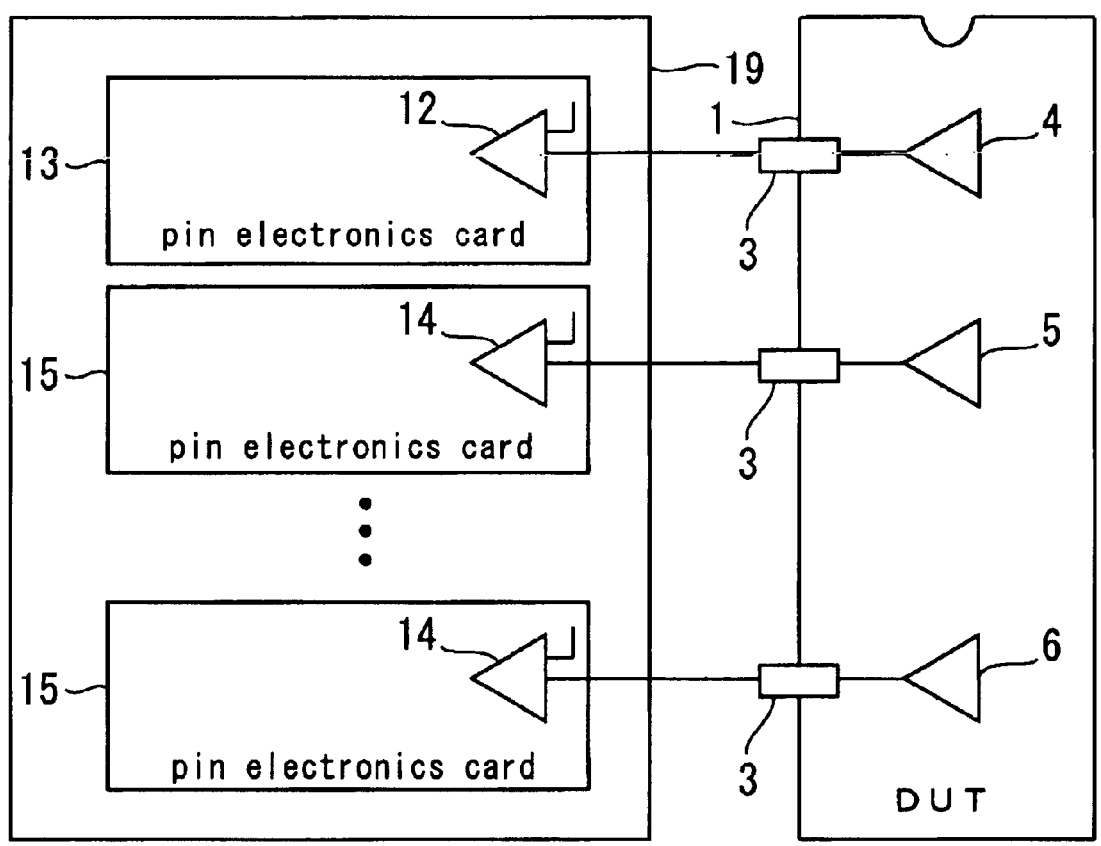
FIG. 7 is a schematic diagram in which the tester and the DUT are connected to each other for the test according to the fourth embodiment.
Figure 8:
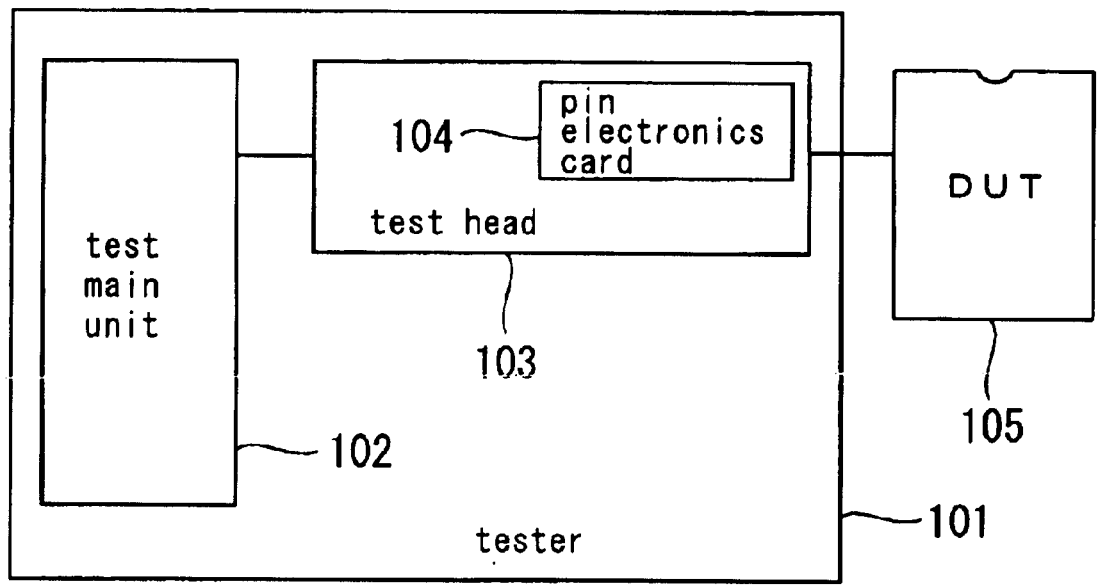
FIG. 8 is a schematic diagram showing a method for testing a semiconductor device according to the related art.

FIGS. 6 and 7 are schematic diagrams showing a fourth embodiment of the present invention. FIG. 6 is a schematic diagram showing the configuration of the tester 11 according to the fourth embodiment, while FIG. 7 is a schematic diagram in which the tester 11 and the DUT 1 are connected to each other for the test. The configuration of the DUT 1 according to the fourth embodiment is the same as that according to the first embodiment.

Figure 9:
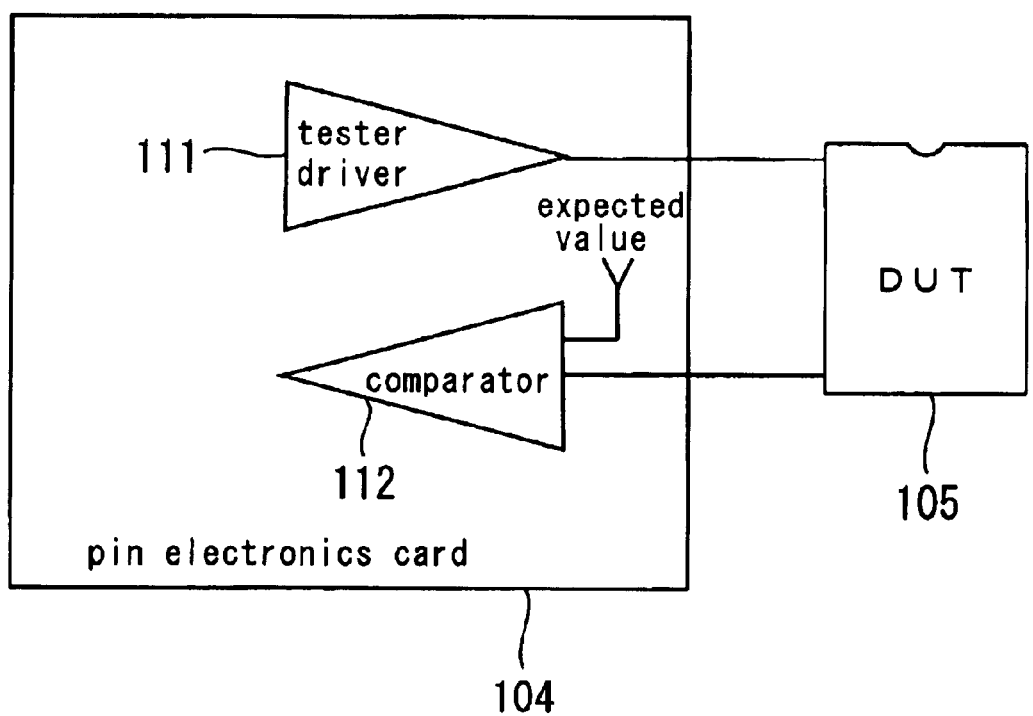
FIG. 9 is a schematic diagram showing the configuration of the pin electronics card.

As shown in FIG. 6, the tester 11 of the fourth embodiment comprises: one pin electronics card 13 which includes a high-precision comparator 12; and a plurality of pin electronics cards 15 which each include a comparator 14 having low precision as compared with the high-precision comparator 12. The pin electronics card 13 and the pin electronics cards 15 are provided on the test head 19 of the tester 11 and each include a tester driver (not shown) as in FIG. 9. The test head 19 is connected to a tester main unit 21 that generates a test pattern signal.

As in the first embodiment, of the output buffer circuits 4, 5, 6, and so on included in the DUT 1, only one output buffer circuit (in this case, the output buffer circuit 4) has the delay circuit 8. In the test, the output terminal 3 to which the output buffer circuit 4 is connected is connected to the comparator 12 of the pin electronics card 13, while the output terminals 3 to which the output buffer circuits 5, 6, and so on are connected are connected to the comparators 14 of the pin electronics cards 15, as shown in FIG. 7.

In this arrangement, test signals are applied from the tester drivers included in the pin electronics card 13 and the pin electronics cards 15 to the DUT 1. The DUT 1 in turn outputs output signals from its internal circuit 7 through the output buffer circuit 4 and the delay circuit 8, and through the output buffer circuits 5, 6, and so on, based on the applied test signals. The comparator 12 compares the output of the output buffer circuit 4 with its expected value to evaluate the timing speed characteristics of the DUT 1. The comparators 14, on the other hand, compare the outputs of the other output buffer circuits 5, 6, and so on with their expected values to evaluate the logic function of the DUT 1.

Thus, the high-precision comparator 12 is included in the pin electronics card 13 to which the output buffer circuit 4 having the delay circuit 8 is connected, it is possible to detect the output of the output buffer circuit 4 with high precision and evaluate the timing speed characteristics. On the other hand, the other pin electronics cards 15 may each include a comparator 14 whose accuracy is comparatively low but high enough to evaluate the logic function based on the outputs of the output buffer circuits 5, 6, and so on. Thus, this arrangement requires only one high-precision comparator 12, considerably reducing the cost of the tester 11.

According to the fourth embodiment described above, of the evaluation comparators included in the tester 11, only one comparator (comparator 12) need be of high-precision type to be able to perform a timing test and a functional test on the high-speed DUT 1 with high precision. Thus, it is possible to considerably reduce the cost of the tester 11 and perform a highly reliable test.

Configured as described above, the present invention has the following effects.

Since a delay means is provided in a specific buffer circuit to delay a signal from an internal circuit, it is possible to measure a delay time from an input test signal even when a high-speed device is tested. Thus, it is possible to evaluate the timing delay characteristics of a semiconductor device with high precision and thereby provide a highly reliable semiconductor device.

Since the delay means is composed of an even number of inverter circuits connected in series, it is possible to delay a signal from an internal circuit while reducing a change in the signal waveform.

There are provided a bypass line connected in parallel with the delay means, and a relay means for sending a signal from an internal circuit to an output terminal through either the delay means or the bypass line. Therefore, when the delay means need not be used in actual operation of the device, the device can be operated without using the delay means.

It is possible to evaluate the logic function of a semiconductor device based on an output signal from an output terminal to which no delay means is connected.

Since an output signal is delayed and timing delay characteristics are evaluated based on the delay time of the output signal from the test signal, high-precision evaluation can be ensured.

Since a delay time is obtained based on a waveform observed on an oscilloscope, it is possible to simplify the configuration of the tester and evaluate a semiconductor device with high precision using existing facilities.

Since a specific comparison means is made higher than the other comparison means in the capability of evaluating timing delay characteristics, only one comparison means included in a tester need be of high-precision type to be able to perform a timing test and a functional test on a high-speed semiconductor device with high precision. Therefore, it is possible to considerably reduce the cost of the tester and perform a highly reliable test.

Since the delay time of an output signal from a test signal is compared with its expected value, it is possible to accurately evaluate the timing delay characteristics.

Since an output signal input to a specific comparison means is delayed from output signals input to the other comparison means, it is possible to perform a timing test and a functional test on a high-speed semiconductor device with high precision by configuring the tester so that only the specific comparison means is of high-precision type.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-290976, filed on Sep. 25, 2001 including specification, claims, drawings and summary, on which the Convention priority of the present application is based, are incorporated herein by reference in its entirety.

What is claimed is:

1. A semiconductor device comprising:
   a plurality of output terminals through which signals from an internal circuit are output;
   a plurality of buffer circuits each provided between one of said plurality of output terminals and said internal circuit; and
   a delay means connected to a specific one of said plurality of buffer circuits, said delay means delaying a signal from said internal circuit.

2. The semiconductor device according to claim 1, wherein said delay means is composed of an even number of inverter circuits connected to on another in series.

3. The semiconductor device according to claim 1, further comprising:
   a bypass line connected in parallel with said delay means; and
   a relay means for sending a signal from said internal circuit to said output terminal through either said delay means or said bypass line.

4. The semiconductor device according to claim 2, further comprising;
   a bypass line connected in parallel with said delay means; and
   a relay means for sending a signal from said internal circuit to said output terminal through either said delay means or said bypass line.

* * * * *